(12) United States Patent
Huang

(10) Patent No.: US 8,134,389 B2
(45) Date of Patent: Mar. 13, 2012

(54) PROGRAMMABLE FREQUENCY DIVIDER

(75) Inventor: Zhibin Huang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/731,591

(22) Filed: Mar. 25, 2010

(65) Prior Publication Data

US 2011/0234265 A1  Sep. 29, 2011

(51) Int. Cl.
*H03B 19/00* (2006.01)
(52) U.S. Cl. ............. 327/117; 327/115; 377/47
(58) Field of Classification Search ........... 327/115, 327/117, 118, 360; 377/47, 48
See application file for complete search history.

(56) References Cited

U.S. PATENT DOCUMENTS

| | | | | |
|---|---|---|---|---|
| 4,555,793 A * | 11/1985 | Benamy | .......... | 377/48 |
| 4,856,032 A * | 8/1989 | Klekotka et al. | .......... | 377/47 |
| 4,891,825 A * | 1/1990 | Hansen | .......... | 377/52 |
| 5,177,771 A * | 1/1993 | Glassburn | .......... | 377/39 |
| 5,524,035 A * | 6/1996 | Casal et al. | .......... | 377/47 |
| 6,795,519 B2 * | 9/2004 | Chakravarthy | .......... | 377/48 |
| 6,856,184 B2 | 2/2005 | Hidai | | |
| 6,914,469 B2 | 7/2005 | Hidai | | |
| 7,640,449 B2 | 12/2009 | Ham | | |
| 2008/0219399 A1 * | 9/2008 | Nary | .......... | 377/47 |

\* cited by examiner

*Primary Examiner* — Lincoln Donovan
*Assistant Examiner* — William Hernandez
(74) *Attorney, Agent, or Firm* — Lawrence J. Merkel; Meyertons, Hood, Kivlin, Kowert & Goetzel, P.C.; Erik A. Heter

(57) ABSTRACT

A clock divider and method of operating the same. In various embodiments, the clock divider may be configured to divide clock frequencies by both even and odd divisors. The divisor may be an integer that is represented by an N-bit value, and the clock divider may be programmable by writing the N-bit value to a register. The divisor may be even or odd. During operation, the clock divider may decrement a counter down from an initial value (derived from the N-bit value representing the divisor) to a trigger value. When the trigger value is detected, the clock divider may cause the output clock to toggle. The trigger value may depend on whether the divisor is even or odd. The clock divider may be re-programmed during operation by writing a new N-bit value into the register. Re-programming may include changing the divisor from an even value to an odd value.

21 Claims, 6 Drawing Sheets

PROGRAMMABLE FREQUENCY DIVIDER

BACKGROUND

1. Field of the Invention

This invention relates to electronic circuits, and more particularly, to clock circuits.

2. Description of the Related Art

Clock dividers are commonly used in synchronous circuits. Generally speaking, a clock divider may be a circuit that receives a first clock signal at a first frequency and outputs a second clock signal at a second frequency lower than the first. The lower frequency of the second clock signal may be obtained by "dividing" the first clock signal by a specified divisor. For example, a clock divider may receive a first clock signal having a frequency of 100 MHz, and output a second clock signal having a frequency of 50 MHz. Accordingly, the second clock signal may be obtained by dividing the frequency of the first clock signal by a divisor of two in this example.

Some clock dividers may be configured to divide the frequency of an input clock signal by an even divisor (e.g., 2, 4, 6, etc.). Other clock dividers may be configured to divide the frequency of a clock signal by an odd divisor (e.g., 3, 5, 7, etc.). Furthermore, some clock dividers may be programmable in that the divisor may be selectable and changeable during operation. Clock dividers that are programmable and that may divide the frequency of an input clock signal by either an even or odd divisor may also be implemented. Such a clock divider may be obtained by providing completely separate odd and even clock divider circuits and selecting the even clock divider or the odd clock divider based on the divisor.

SUMMARY

A clock divider and method of operating the same is disclosed. In various embodiments, the clock divider may be configured to divide clock frequencies by both even and odd divisors. The divisor may be an integer that is represented by an N-bit value, and the clock divider may be programmable by writing the N-bit value to a register. The divisor may be even or odd. During operation, the clock divider may decrement a counter down from an initial value (derived from the N-bit value representing the divisor) to a trigger value. When the trigger value is detected, the clock divider may cause the output clock to toggle. The trigger value may depend on whether the divisor is even or odd. The clock divider may be re-programmed during operation by writing a new N-bit value into the register. Re-programming may include changing the divisor from an even value to an odd value.

In one embodiment, a clock divider includes a divisor register, a counter unit, a detection unit, and an output unit. The divisor register may receive and store the N-bit divisor that indicates the integer value by which the frequency of an input clock signal is to be divided. The counter unit may be loaded with the N-bit divisor at the beginning of a division phase. After loading the divisor, the counter may begin decrementing, starting with a value derived from the N−1 most significant bits of the divisor. The counter may decrement to a trigger value that is detected by the detection unit. Responsive to detecting the trigger value, the detector may assert one of either a first or second trigger signal, depending on whether the divisor is even or odd, respectively. Assertion of the trigger signal may cause the N-bit divisor to be reloaded into the counter. The detection unit may also assert a toggle signal responsive to detecting the trigger value. The output unit may respond to receiving the toggle signal by toggling the output clock signal.

In various embodiments, the clock divider may also include a bypass circuit. The bypass circuit may be configured to detect when each of the N bits of the divisor are logic 0's (thereby indicating that the input clock is not to be divided). The bypass circuit may then cause the input clock to be conveyed as the output clock of the clock divider.

As previously noted, a detection unit in one embodiment may assert a first trigger signal or a second trigger signal depending upon whether the divisor is even or odd, respectively. The counter value may include N−1 bits, with the initial counter value being derived from the N−1 most significant bits of the N-bit divisor. In one embodiment, the trigger value is reached for an even divisor when the counter value has decremented to a point wherein each of the N−1 bits is a logic 0. In the same embodiment, the trigger value may be reached for an odd divisor when all but the least significant one of the N−1 bits is a logic 0. In one embodiment, the detection unit may read the least significant bit of the N-bit divisor to determine whether its corresponding integer value is even or odd.

One embodiment of a method for operating a clock divider includes a counter decrementing from an initial counter value (derived from a divisor) to one of either a first trigger value (if the divisor is even) or a second trigger value (if the divisor is odd). The method may further include asserting a first trigger signal responsive to detecting the first trigger value (when the divisor is even) or asserting a second trigger signal responsive to detecting the second trigger value (when the divisor is odd). A toggle signal may be asserted responsive to assertion of either of the first or second trigger signals. Assertion of the toggle signal may in turn cause an output clock signal to change states (e.g., logic 1 to logic 0 or vice versa). The method may be implemented such that rising and falling clock edges of the output clock signal are synchronized to rising clock edges of the input clock signal when the divisor is even. When the divisor is odd, rising and falling edges of the output clock signal may be synchronized to rising and falling edges, respectively, of the input clock signal. The method may repeat itself over a number of cycles, thereby dividing the frequency of the input clock signal to produce an output clock signal.

BRIEF DESCRIPTION OF THE DRAWINGS

The following detailed description makes reference to the accompanying drawings, which are now briefly described.

Figure 1:
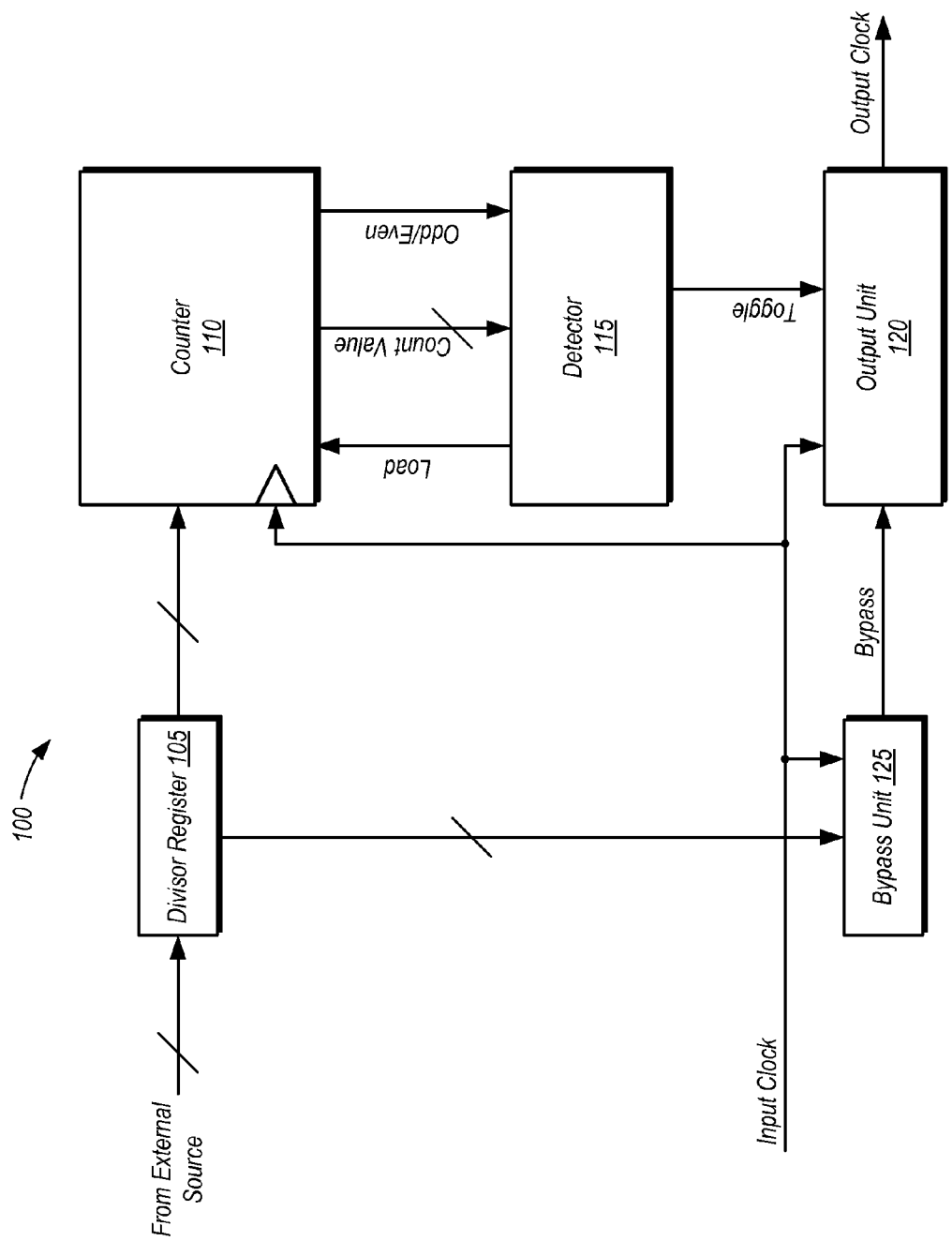
FIG. 1 is a block diagram of one embodiment of a clock divider.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Block Diagram:

Turning now to FIG. 1, a block diagram of one embodiment of a clock divider is shown. In the embodiment shown, clock divider 100 includes a divisor register 105, a counter 110, a detector 115, an output unit 120, and a bypass unit 125. Counter 110, bypass unit 125, and output unit 120 may each be coupled to receive an input clock signal. Output unit 125 may provide an output clock signal having a frequency that is less than or equal to the frequency of the input clock signal. An output clock signal having a frequency less than the input clock signal may be obtained by dividing the input clock signal (and more particularly, dividing the frequency of the input clock signal). In the embodiment shown, clock divider 100 is configured to divide the frequency of the input clock by one of a number of integer values, e.g., 2, 3, 4, 5, etc. These integer values may be even or odd. In general, the N-bit divisor value may be a divisor value that is equivalent to an integer value of M.

Divisor register 105 in the embodiment shown is coupled to receive a divisor from an external source. The external source may be another unit of an integrated circuit (IC) in which clock divider 100 is implemented, a source accessible to a user of the device in which clock divider 100 is implemented, and so forth. Clock divider 100 may be programmed by writing an N-bit divisor value into divisor register 105, where it may then be stored until a new value is written therein or until power is removed. The N-bit divisor may represent an integer value by which the frequency of the input clock is to be divided. As noted above, the integer value may be even or odd, and clock divider 100 may be programmable for divisor values representing both even and odd integers. Specifically, in one embodiment, the binary value of the divisor may be one less than the integer value being represented. Thus, division by one (or no division) may be represented by an N-bit divisor value of all zeros; division by two may be represented by an N-bit divisor value of binary 1, and so forth. Thus, the least significant bit (LSB) of the divisor value being a 0 indicates an odd integer value and an LSB value being 1 indicates an even value in this embodiment.

Divisor register 105 may be implemented using any suitable circuitry that enables writing and re-writing the N-bit divisor value, as well as storing the same. Types of circuitry used to implement divisor register 105 include (but are not limited to) static RAM (random access memory), dynamic RAM, flash memory, flip-flops, registers, and so forth.

The N-bit divisor value stored in divisor register 105 may be loaded into counter 110 responsive to a load signal asserted by detector 115. Counter 110 may derive an initial counter value from the N-bit divisor. In one embodiment, the initial counter value may be derived from the N−1 most significant bits of the divisor value. Specifically, the initial counter value may be equal to the N−1 most significant bits of the N-bit divisor value. During each division phase, counter 110 may decrement the counter value from the initial counter value down to a trigger value. The counting operation performed by counter 110 is synchronized to the input clock signal in this embodiment. Accordingly, counter 110 may decrement the counter value once each input clock cycle. Counter 110 may provide the current counter value to detector 115, which may be configured to detect when the trigger value is reached. Counter 110 may also be coupled to provide an odd/even indication to detector 115 to indicate whether or not the integer value represented by the N-bit divisor value is even or odd. In one embodiment, the least significant bit (LSB) of the N-bit divisor value may be used to indicate whether or not the divisor is even or odd. The odd/even indication may be used by detector 115 to determine when the trigger value has been reached, as this value may be different for odd and even divisors.

Detector 115 may monitor the count value received from counter 110. As previously noted, the count value may be decremented by counter 110 once each clock input clock cycle in this particular embodiment. Detector 115 may thus receive an updated count value once for each cycle of the input clock signal. After the count value has been decremented to the trigger value, detector 115 may assert the load signal as well as a toggle signal. The load signal may be provided to counter 115, and may cause the divisor value stored in divisor register 105 to be re-loaded into counter 110 in order to restart the division phase. The toggle signal may be provided to output unit 120 to indicate that the current division phase has ended. Accordingly, each division phase may correspond to one phase of the output clock signal. Since the division phases for a given divisor are of equal length, a 50% duty cycle output clock signal may be generated for both even and odd divisor. The operation of one embodiment of detector 115 will be discussed in further detail below.

In the embodiment shown, output unit 120 is coupled to receive the toggle signal. Responsive to receiving an asserted toggle signal, output unit 120 is configured to change the state of an output clock signal. For example, on a first phase of division, output unit 120 may toggle the output clock signal from a logic high value to a logic low value responsive to receiving an asserted toggle signal. On the next phase of division, the output unit 120 may toggle the output clock signal from a logic low back to a logic high responsive to receiving another asserted toggle signal from detector 115. This cycle of toggling the output clock signal from high to low and low to high may repeat itself to generate an output clock signal having a frequency that is an integer dividend of that of the input clock signal. A more detailed description of one embodiment of an output unit will be provided below.

As previously noted, the embodiment of clock divider 100 shown in FIG. 1 includes a bypass unit 125, which is coupled to receive the N-bit divisor value from divisor register 105. Bypass unit 125 is configured to detect if the N-bit divisor indicates that the input clock signal is not to be divided (or, viewed in another way, indicates the integer value indicated by the N-bit divisor is 1). As mentioned previously, an N-bit divisor value of all binary 0's indicated a divisor of one in this embodiment. Thus, if each of the N bits of the N bit divisor is a logic 0, bypass unit 125 will assert the bypass signal. Responsive to receiving the asserted bypass signal, output unit 120 may provide the input clock signal as the output clock signal, thereby bypassing the normal division process that would otherwise occur if the N-bit divisor indicates that the integer value is a value greater than 1. Bypass unit 125 may be implemented in such a manner that entering into or exiting from the bypass mode does not create a pulse that is more narrow than that of the input clock. Accordingly, entry into and exit from the bypass mode may be performed without glitches.

Figure 2:
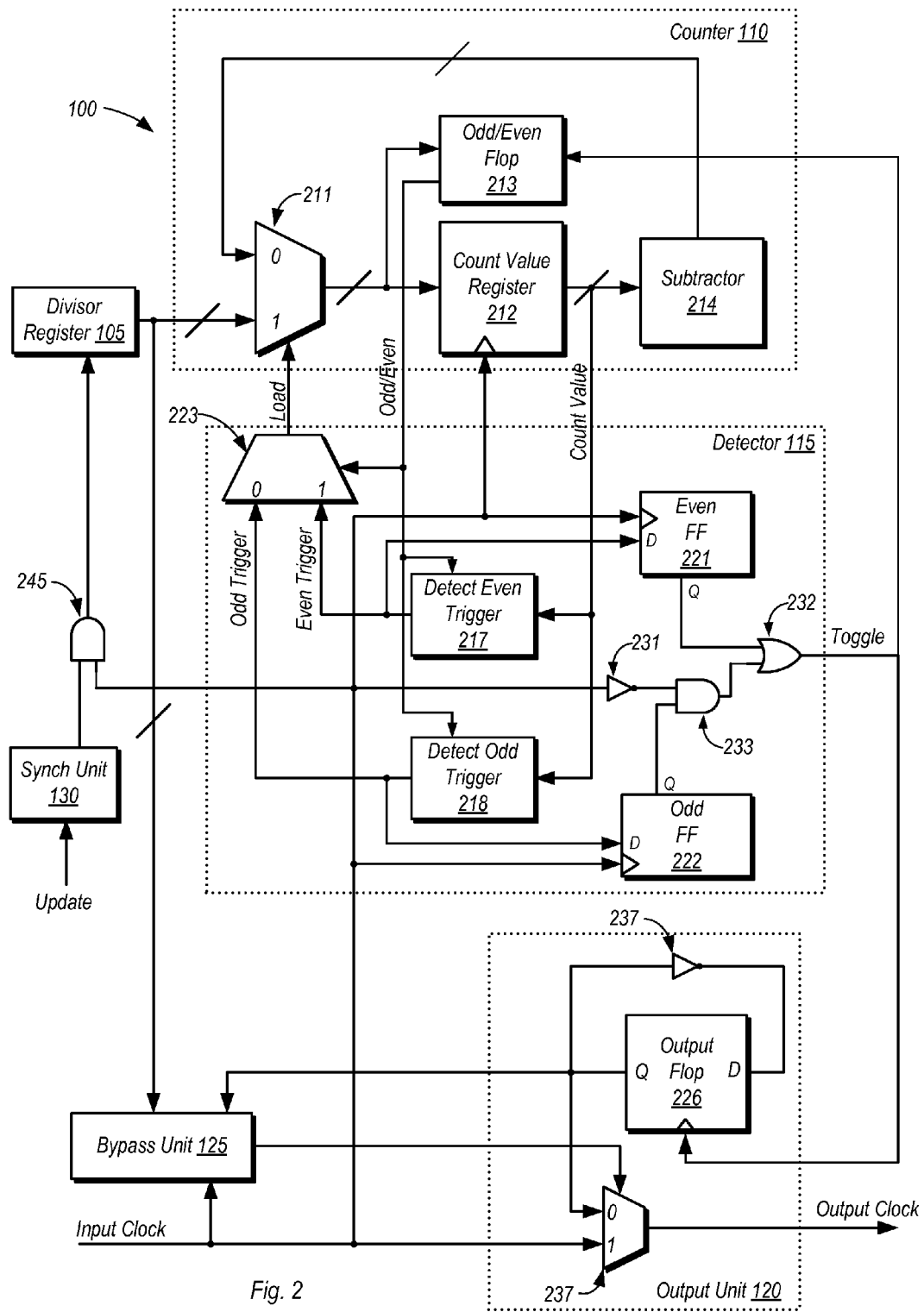
FIG. 2 is a logic diagram illustrating one embodiment of a clock divider.

Logic Diagram:

FIG. 2 is a logic diagram illustrating one embodiment of a clock divider 100. In the embodiment shown, clock divider 100 includes each of the same basic components (divisor register 105, counter 110, detector 115, output unit 120, and bypass unit 125) as the embodiment shown in FIG. 1. Various ones of these units are shown in greater detail in FIG. 2.

Counter 110 in the embodiment shown includes a selector circuit 211, which includes first and second multi-bit inputs. One of the multi-bit inputs of selector circuit 211 is coupled to divisor register 105, while the other multi-bit input is coupled to the output of subtractor 214. Selector circuit 211 also includes a select input coupled to receive the load signal in this embodiment. When the load signal is asserted (e.g., a logic 1), the input labeled '1' may be selected, thereby enabling the contents stored in divisor register 105 to be loaded into counter 110. When the load signal is not asserted (e.g., a logic 0), the output from subtractor 214 may be selected and conveyed to the output of selector circuit 211. In accordance with the integer equivalent (M) of the divisor, the load signal may be asserted twice every M input clock cycles in this embodiment. For example, if the integer value of the divisor is 5 (M=5), then the load signal may be asserted twice every 5 input clock cycles. Each assertion of the load signal may occur when the N−1 most significant bits have counted down to a trigger value that is dependent on whether the divisor is odd or even.

When the contents of divisor register 105 are loaded into counter 110, the most significant N−1 bits may be loaded into count value register 212, while the LSB may be loaded into odd/even flop 213 (which may be implemented using a D-type flip-flop or any other circuitry suitable for storing at least one bit). For example, if the divisor value includes 4 bits, the 3 most significant bits may be written into count value register 212, while the LSB may be written into odd/even flop 213. The output of odd/even flop 213 may be provided as the even/odd indication to various circuits in detector 115.

The most significant N−1 bits of the divisor value loaded into count value register 212 may comprise an initial count value used at the beginning of a division phase. Counter 110 may decrement this value from the initial count value down to a trigger value. Decrementing the count value may be performed by providing the count value to subtractor 214. In this embodiment, subtractor 214 may subtract a value of logic 1 from the count value, once during each cycle of the input clock signal. For example, if an initial count value loaded into count value register 212 is logic 111, the next count value, produced by subtractor 214, may be logic 110. The subtracted count value obtained by subtractor 214 may be fed back into count value register 212 through selector 211 when the load signal is de-asserted, causing the count value to be updated with a value that is decremented by a logic 1 from the previous count value. This cycle may continue until a trigger value is reached, as detected by detector 115.

The count value output by count value register 212 is provided to detector 115 in the embodiment shown. More particularly, detector 115 in this embodiment includes a first detection circuit 217 configured to detect the trigger value for an even divisor, and a second detection circuit 218 configured to detect the trigger value for an odd divisor. In addition to being coupled to receive the current count value from count value register 212, detection units 217 and 218 may be coupled to receive the odd/even indication from odd/even flop 213. The odd/even indication received from odd/even flop 213 may be used to enable one of detection units 217 and 218. More particularly, detection circuit 217 may be enabled if the odd/even indication indicates an even divisor, while detection circuit 218 may be enabled if an odd divisor is indicated.

As previously noted, the trigger value may be different for even and odd divisors. In the embodiment shown, the trigger value may be reached for even divisors when each of the N−1 bits of the count value is a logic 0. For example, for a 3-bit count value (i.e. N−1=3, N=4), the trigger value for an even divisor may be equivalent to count value of logic 000. Similarly, for a 3-bit count value, the trigger value for an odd divisor in this embodiment may be equivalent to a count value of logic 001. When an active one of detection circuit 217 and 218 detects its corresponding trigger value, it may assert a corresponding even or odd trigger signal, respectively.

Even and odd detection circuits 217 and 218, in this embodiment, are each coupled provide their respective trigger signals to a corresponding input of selection circuit 223, which is also coupled to receive the odd/even indication on its select input. If the integer value indicated by the N-bit divisor is odd, then assertion of the odd trigger signal by odd detection circuit 218 may in turn cause the assertion of the load signal. If the integer value indicated by the N-bit divisor is even, then assertion of the even trigger signal by even detection circuit 217 may also cause the assertion of the load signal. In either case, assertion of the load signal may in turn cause the contents of divisor register to be reloaded into counter 110, and thus the contents of count value register 212 to be loaded with the N−1 most significant bits of the N-bit divisor value as the initial count value. The active one of even and odd detection circuits 217 and 218, respectively, may in turn detect, on the next input clock cycle, that the count value provided by count value register has been updated responsive to the load of the N-bit divisor value, thereby causing a de-assertion of the active trigger signal. Thus, for each phase of division, a trigger signal (even or odd) may be asserted for one input clock cycle, enabling the contents of the divisor register to be loaded into counter 110. The output of subtractor may be fed back to update the count value output by count value register 212 for the remainder of input clock cycles of a phase of division while the corresponding even or odd trigger signal is de-asserted.

Assertion of one of the even or odd trigger signals by even detection circuit 217 or odd detection circuit 218, respectively, may in turn also cause assertion of the toggle signal by OR gate 232. In the embodiment shown, even detection circuit 217 is coupled to provide the even trigger signal to even flip-flop 221, while the odd detection circuit 218 is coupled to provide the odd trigger signal to odd flip-flop 222. The even trigger signal may be provided to a D-input of even flip-flop 221. On the next clock cycle following the assertion of the even trigger signal, even flip-flop 221 may provide a logic high (e.g., a logic 1) on its Q output. This logic high from even flip-flop 221 may cause OR gate 232 to assert the toggle signal.

If the odd detection circuit 218 is enabled and detects the odd trigger value, the odd trigger signal may be asserted and provided to the D input of odd flip-flop 222. Responsive to receiving the odd trigger signal on its D input, odd flip-flop 222 may assert its Q output on the next input clock cycle. The output from odd flip-flop 222 may be provided to one input of AND gate 233. The other input of AND gate 233 may transition to a logic high (e.g., logic 1) when the input clock falls low. When both inputs to AND gate 233 are logic 1's, its output may be asserted and may propagate through OR gate 232 to assert the toggle signal. Accordingly, the toggle signal for an odd divisor may be asserted on the falling edge of the input clock signal providing the extra one half input clock cycle needed for an odd divisor. When the toggle signal is asserted responsive to the falling edge of the input clock signal, odd/even flop 213 may be forced to transition from odd to even so that the assertion of the toggle signal will synchronize the rising of the output clock signal with the rising of the input clock signal, via even flip flop 221. Odd/even flop 213 may be reset to the odd state responsive to the next reload of the divisor value.

Output unit 120 in the embodiment shown includes output flop 226, inverter 237, and selection circuit 238. When the bypass signal is not asserted, selection circuit 238 may select the 0 input which is coupled to the Q output of output flop 226. Thus, when not in bypass mode, the output clock signal provided by output unit 120 may be generated by output flop 226.

Output flop 226 and inverter 237 are arranged to form a divide-by-two circuit in this embodiment. That is, for each two pulses on the clock input of the output flop 226, one cycle of the output clock occurs. Moreover, the D input and the Q output of output flop 226 may be in opposite logical states. Thus, when the Q output toggles to a first logic state (e.g., a logic 1), the D output may, responsive thereto, toggle to a second logic state (e.g., a logic 0). In this embodiment, output flop 226 is an edge-triggered flip flop. Accordingly, even though the state of the D input may be different from the Q output, the clocked keeper formed with inverter 237 may hold a given state until the next triggering edge (e.g., the next rising edge).

In the embodiment shown, the toggle signal provided from detector 115 is utilized as the clock signal for output flop 226. Thus, on a rising edge of the toggle signal, the Q output of output flop 226 may change states (and may thus change the state of the D input via inverter 237). When not in bypass mode in this embodiment, the toggling of the Q output of output flop 226 may thus cause the output clock signal to change states correspondingly. Accordingly, in the embodiment shown, the output clock signal is toggled from one logic state to the other responsive to assertion the toggle signal by detector 115.

During each division phase of operation for the embodiment shown in FIG. 2, the output clock signal is toggled once. The events in detection unit 115 that cause the output clock signal to be toggled may also cause counter 110 to be reloaded with the N-bit divisor value. On the next input clock cycle after reloading the N-bit divisor, counter 110 may begin decrementing the count value until the trigger value is again detected, resulting again in the toggling of the output signal and the reloading of the N-bit divisor. This may repeat itself over a number of phases of division, with the output clock signal transitioning logic states (e.g., from clock high to clock low on one division phase, and clock low to clock high on the next division phase) once each division phase.

In the embodiment shown, divider 100 includes a bypass unit 125, which is coupled to divisor register 105. If the N-bit divisor indicates that the frequency of the input clock signal is not to be divided (i.e. the N-bit divisor value is binary 0, indicating division by one), bypass unit may assert a bypass signal. Assertion of the bypass signal may in turn cause the input clock to be selected by selection circuit 238 (i.e. by selecting the '1' input). When operating in the bypass mode, the input clock signal may propagate through selection circuit 238 and may thus be provided as the output clock signal.

Bypass unit 125 may also receive both the input and output clock signals in order to control the timing of the assertion and/or de-assertion of the bypass signal. This in turn may be useful in preventing glitches in the output clock signal when entering or exiting the bypass mode. Following the detection that the divisor is one, the bypass signal may be inhibited from assertion until at least one output clock state change has occurred and two or more input clock cycles have elapsed. The assertion of the bypass signal may also be dependent on both the input and output clock states being equivalent (e.g., both clock high) as a condition of assertion. Controlling the assertion of the bypass signal in this manner may prevent the occurrence of an output clock pulse that has a pulse width less than 50% of the input clock cycle (and thus a higher frequency). This may in turn prevent erroneous operation from occurring in synchronous circuits that are coupled to receive the output clock signal, and are not configured to operate at frequencies higher than that of the input clock signal.

Divider 100 also includes a synchronization unit 130 in this particular embodiment. Synchronization unit 130 may receive an update signal when a change of divisors is to occur. The synchronization unit may in turn assert an update ready signal that is provided to an input of AND gate 245. The input clock signal may also be provided to an input of AND gate 245. When both the update ready and input clock signals are high, divisor register 105 may be updated with a new N-bit divisor value. Otherwise, divisor register 105 may be inhibited from updating.

It should be noted that the particular arrangement shown in FIG. 2 is but one possible arrangement of divider 100. Other logic circuits and arrangements may also be used to realize the basic operation described above, as will be apparent to those skilled in the art.

Figure 3:
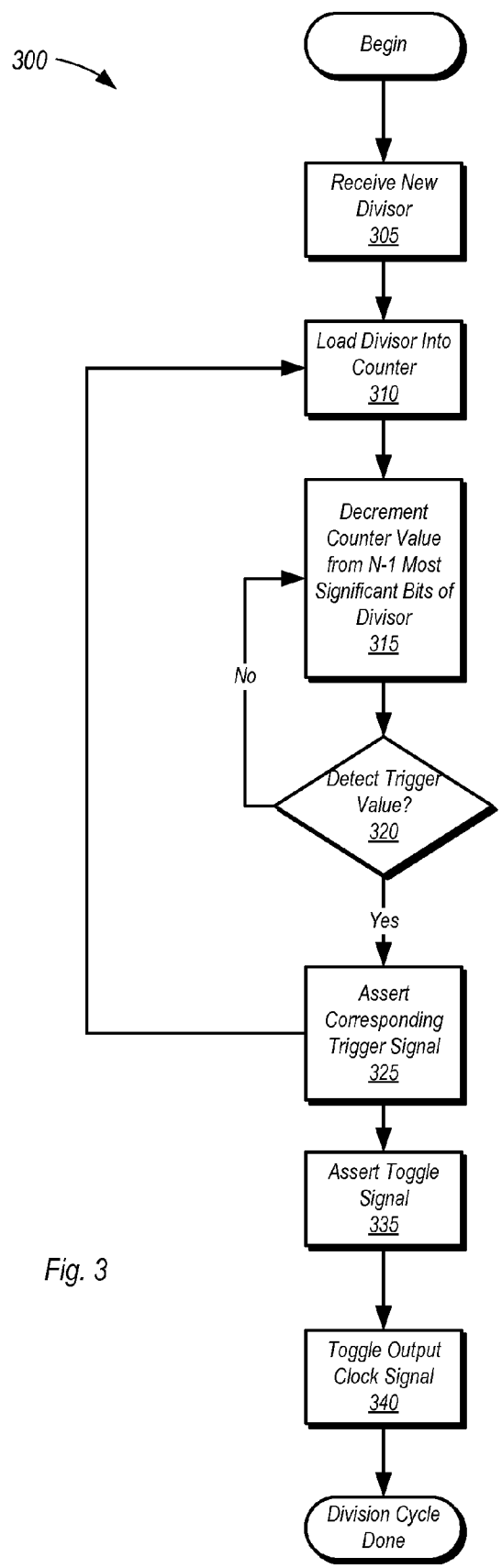
FIG. 3 is a flow diagram illustrating the operation of one embodiment of a clock divider circuit.

Flow Diagram:

FIG. 3 is a flow diagram illustrating the operation of one embodiment of clock divider 100 discussed above. More particularly, FIG. 3 illustrates the operations for a division phase that results in the toggling of the output clock signal from one logic state to the other.

In the embodiment shown, method 300 begins with the receiving and storing of a divisor value (block 305). The divisor value may be an N-bit value that is indicative of an integer value (e.g., 2, 3, 4, 5, etc.) by which the frequency of an input clock signal is to be divided. Since the various embodiments of a divider described herein are capable of dividing clock signal frequencies by both even and odd integer divisors, the N-bit divisor value may thus represent an even integer or an odd integer. The N-bit divisor value may be received by and stored in a register (e.g., divisor register 105) or other storage mechanism.

The N-bit divisor value may be loaded into a counter (block 310). The counter (e.g., counter 310) may derive an initial counter value from the N−1 most significant bits of the N-bit divisor value, while using the LSB as an indication of whether the represented integer value is even or odd. This may be accomplished by writing the N−1 most significant bits of the divisor to a register (e.g., count value register 212), while the LSB may be written to a flip-flop (e.g., odd/even flop 213) that is separate from the register.

On a next input clock cycle after loading the N-bit divisor into the counter, the derived counter value may be decremented (block 315). If a predetermined trigger value has not been reached (block 320, no), then the decrementing may continue for subsequent cycles of the input clock signal. If the predetermined trigger value has been reached (block 315, yes), then a corresponding trigger signal may be asserted (block 325).

It should be noted that the method shown in FIG. 3 may apply to divisor values representing both even and odd integer values. However, the trigger value and thus the assertion of a corresponding trigger signal may be dependent upon whether or not the represented integer value is even or odd. Using the example given above (e.g., N=4, N−1=3), the trigger value for an even integer may be logic 000, and decrementing to this count value may result in the assertion of an even trigger signal. The trigger value for an odd integer may be logic 001, and decrementing to this count value may result in the assertion of an odd trigger signal. It should be noted that these examples are not intended to be limiting, and thus the value of N (and therefore, N−1) may be different in other embodiments, and that the particular value of N is not limited in scope per this disclosure. The method may utilize the LSB of the N-bit divisor value to determine whether or not the represented integer value is even or odd, and thus whether to respond to the even trigger value or the odd trigger value.

The assertion of a corresponding trigger signal (block 325) may lead to the occurrence of multiple events. One of the events resulting from assertion of a trigger signal may be the reloading of the N-bit divisor value into the counter (block 310). Each new division phase may be initiated by the reloading of the N-bit divisor value. It should be noted that during a particular division phase, the divisor register storing the N-bit divisor value may be updated, and thus a subsequent iteration of block 310 may result in reloading a new N-bit divisor value. However, it is also noted that the divisor may remain unchanged for a large number of division phases.

The other event that may occur responsive to the assertion of a corresponding trigger signal is the assertion of a toggle signal (block 335). The assertion of a toggle signal may be accomplished by a detector, such as detector 115 discussed above. The asserted toggle signal may be received by an output unit, such as output unit 120, also discussed above. Responsive to receiving the asserted toggle signal, the output clock signal may be toggled (block 340) from one logic state to the next (low to high or high to low). The toggling of the output clock signal may indicate completion of the current division phase. However, it is noted that a new division phase may have already commenced based on the reloading of the N-bit divisor value into the counter (block 310) responsive to the assertion of the trigger signal (block 325).

Figure 4:
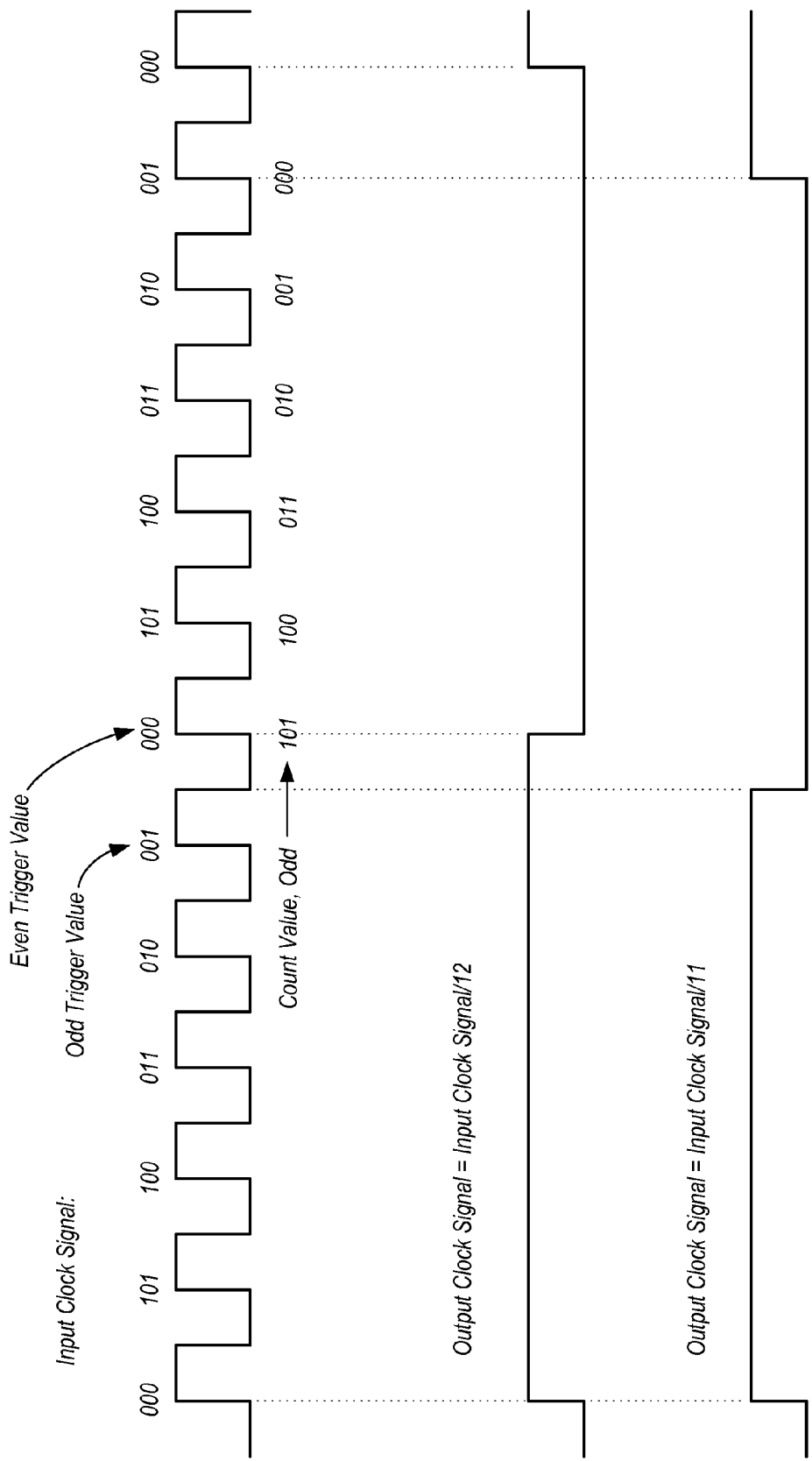
FIG. 4 is a timing diagram illustrating the operation of one embodiment of a clock divider circuit.

Timing Diagram:

FIG. 4 is a timing diagram illustrating the operation of one embodiment of a clock divider. Because the trigger values for odd and even divisors may be different, the timing of edges of the output clock with respect to those of the input clock may be different for even and odd divisors. In one embodiment, rising edges of the output clock signal may be synchronized to the rising edges of the input clock signal for even divisors. In the same embodiment, for odd divisors, rising edges and falling edges of the output clock signal may be synchronized to rising and falling edges of the input clock signal, respectively. FIG. 4 illustrates the timing for one such embodiment.

In the example of FIG. 4, N=4, and thus N−1=3. The example shown herein is for an N-bit divisor value representing the integer value 12 (binary 1011), and for another N-bit divisor value representing the integer value 11 (binary 1010). For both of these values, the N−1 most significant bits (and thus the initial counter value) is 101. For the integer value 12, which is even, the LSB is 1, while the integer value for the odd value of 11 is 0.

After an initial loading of the N-bit divisor, the counter value may decrement on successive clock cycles, from 101, to 100, to 010, to 001, and to 000 if even. When the N-bit divisor value represents an odd integer value, a counter value of 001 is the trigger value. Accordingly, decrementing the counter to this value may cause the assertion of the odd trigger signal, which may thereby result in the toggling of the output clock signal (from high to low, for the output clock signal corresponding to an integer divisor of 11 in the example shown). The high-to-low transition of the output clock signal in this case may occur synchronous with a falling edge of the input clock signal, by virtue of the arrangement shown in FIG. 2, since the input clock must transition low before the output of odd flip-flop 222 can change.

The assertion of the odd trigger signal may also cause the counter to be reloaded, and thus on the next input clock cycle, the counter value may once again by 101. The cycle may repeat itself until the counter value is again decremented to the odd trigger value of 001. Responsive to detecting this trigger value again, the odd trigger signal may again be asserted. The output clock signal may from low to high, in this case, synchronous with the rising edge of the input clock signal. Thus, since the output clock signal is obtained by dividing the frequency of the input clock signal by 11 in this case, the output clock signal may change states once every 5.5 input clock cycles.

When the output clock signal is produced by dividing the frequency of the input clock signal by 12 in this example, the counter value decrements on successive clock cycles 101, to 100, to 010, to 001, to 000. Since 000 is the trigger value in this case, the even trigger signal may be asserted, thereby resulting in the assertion of the toggle signal and the corresponding toggling of the output clock signal. The transition from high to low in this case occurs synchronous with the rising edge of the input clock signal, and occurs after 6 cycles of the input clock signal has elapsed. This process may repeat itself, with the counter value again decrementing from 101 down to 000 on successive input clock cycles, with 6 more input clock cycles elapsing before the output clock signal transitions from low to high. This transition is also synchronous with the rising edge of the input clock signal in this example.

Figure 5:
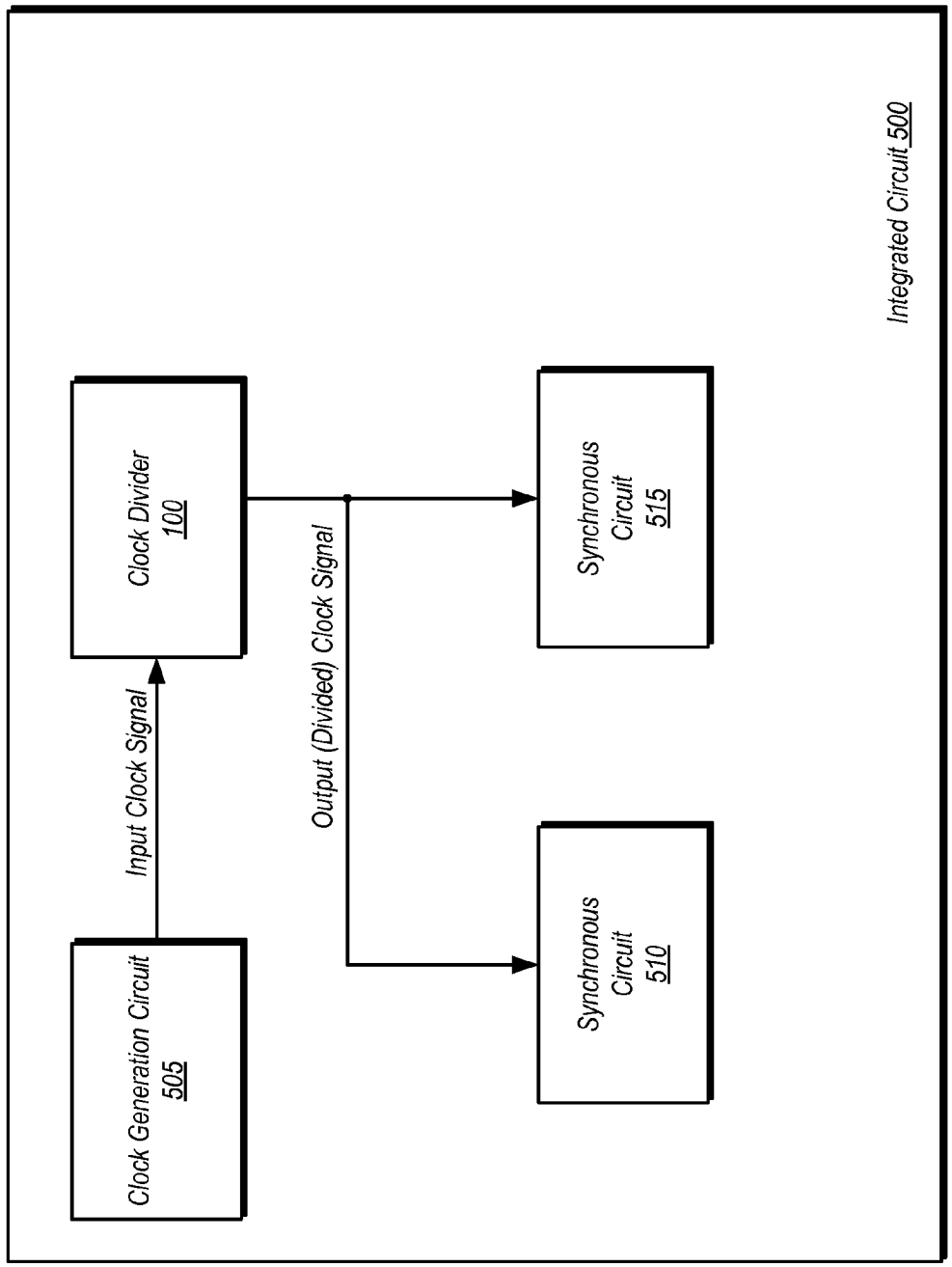
FIG. 5 is a block diagram of one embodiment of an integrated circuit.

Integrated Circuit:

Turning now to FIG. 5, a block diagram of one embodiment of an integrated circuit is shown. In the embodiment shown, integrated circuit 500 includes a clock generation circuit 505, a clock divider 100, and synchronous circuits 510 and 515 coupled to receive an output clock signal from clock divider 100. Clock divider 100 may be a clock divider that operates based on the principles discussed above with reference to FIGS. 1-4.

Clock generation unit 505 may be a phase locked loop or other type of clock generation circuit. Although not explicitly shown, clock generation circuit 505 may receive a reference clock signal from an external source. In other embodiments, the generation of the clock signal may occur entirely on-chip. Clock generation unit 505 may provide an input clock signal to clock divider 100. In turn, clock divider 100 may divide produce an output clock signal by dividing the frequency of the input clock signal. However, clock divider 100 may be configured to operate in a bypass mode, thereby allowing it to provide an output clock signal at the same frequency as the input clock signal.

The output clock signal provided by clock divider 100 may be provided to synchronous circuits 510 and 515. These circuits may include various types of sequential logic circuitry, including (but not limited to) flip-flops, registers, counters, and any other type of circuit that may operate synchronous with a clock signal. The output clock signal provided by clock divider 100 may be used to synchronize the operation of circuitry within synchronous circuits 510 and 515. The frequency of the output clock signal may change in accordance with the various operational demands of integrated circuit 500. For example, if integrated circuit 500 is operating in a low power mode, clock divider may be programmed with a relatively large divisor value to reduce the frequency of the output clock signal. On the other hand, if integrated circuit 500 is operating in a high performance mode, the divisor value with which clock divider 100 is programmed may be small, resulting in an output clock signal having a higher frequency than when the divisor value is large. As noted above, in some cases, the division process may be bypassed (i.e. the frequency is divided by an integer value of 1), thereby resulting in the frequency of the output clock signal being the same as the input clock signal.

It is noted that the embodiment of integrated circuit 500 shown in FIG. 5 is exemplary. Other embodiments are possible and contemplated. Such embodiments may include additional clock generation circuits 505, additional clock dividers 100, and additional synchronous circuits 510 and 515. Furthermore, embodiments are also possible and contemplated wherein input clock generation is performed off-chip, with the input clock signal being provided to clock divider 100 from an external source. It is also noted that clock divider 100 may be programmed on-chip (e.g., by software executing thereon), or may be programmed off-chip (e.g., by a user or by other signals generated external to integrated circuit 500.

Figure 6:
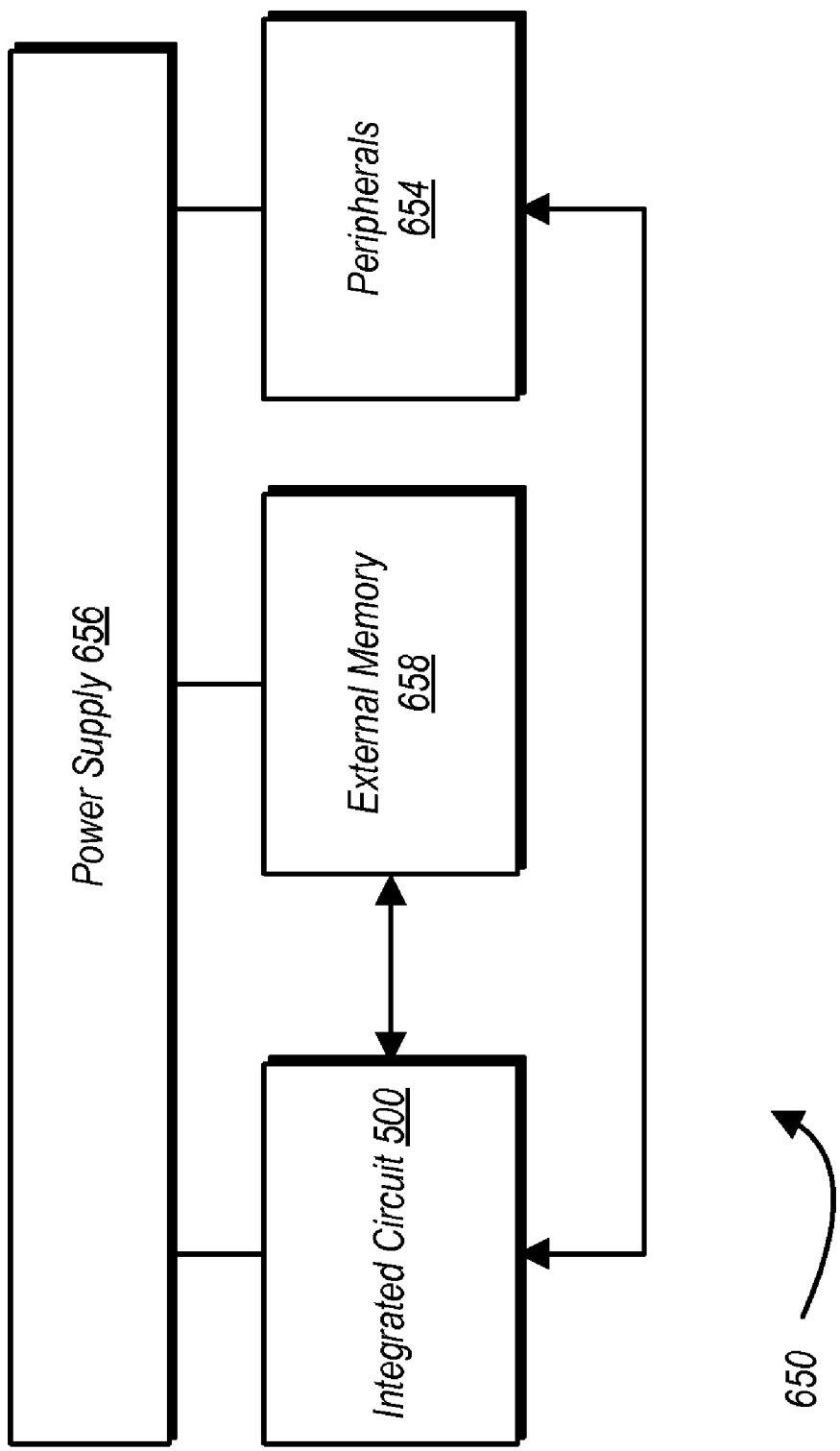
FIG. 6 is a block diagram of one embodiment of a system.

Exemplary System:

Turning next to FIG. 6, a block diagram of one embodiment of a system 650 is shown. In the illustrated embodiment, the system 650 includes at least one instance of an IC 100 (from FIG. 5) coupled to one or more peripherals 654 and an external memory 658. A power supply 656 is also provided which supplies the supply voltages to the IC 100 as well as one or more supply voltages to the memory 658 and/or the peripherals 654. In some embodiments, more than one instance of the IC 100 may be included (and more than one external memory 658 may be included as well).

The peripherals 654 may include any desired circuitry, depending on the type of system 650. For example, in one embodiment, the system 650 may be a mobile device (e.g. personal digital assistant (PDA), smart phone, etc.) and the peripherals 654 may include devices for various types of wireless communication, such as wifi, Bluetooth, cellular, global positioning system, etc. The peripherals 654 may also include additional storage, including RAM storage, solid state storage, or disk storage. The peripherals 654 may include user interface devices such as a display screen, including touch display screens or multitouch display screens, keyboard or other input devices, microphones, speakers, etc. In other embodiments, the system 650 may be any type of computing system (e.g. desktop personal computer, laptop, workstation, net top etc.).

The external memory 658 may include any type of memory. For example, the external memory 658 may be SRAM, dynamic RAM (DRAM) such as synchronous DRAM (SDRAM), double data rate (DDR, DDR2, DDR3, etc.) SDRAM, RAMBUS DRAM, etc. The external memory 658 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A clock divider comprising:
   a divisor register configured to store a divisor by which an input clock signal is to be divided in the clock divider to produce an output clock signal, and wherein a least significant bit (LSB) of the divisor indicates whether the divisor is even or odd;
   a counter unit coupled to receive a counter value derived from the divisor at the beginning of a division phase, wherein the counter unit is configured to, during the division phase, decrement the counter value to a trigger value responsive to the input clock signal, wherein the trigger value is dependent on the LSB of the divisor;
   a detection unit, wherein the detection unit is configured to detect that the counter value is at the trigger value, wherein the detection unit is configured to assert a toggle signal and one of a first trigger signal and a second trigger signal responsive to detecting the trigger value, wherein the counter unit is configured to reload the divisor into the counter unit from the divisor register responsive to receiving either the first trigger signal or the second trigger signal, wherein the first trigger signal is asserted if the divisor is odd and the second trigger signal is asserted if the divisor is even; and
   an output unit, wherein the output unit is configured to toggle the output clock signal responsive to receiving the asserted toggle signal.

2. The clock divider as recited in claim 1, wherein the divisor is N bits, and wherein a beginning value of the counter value is the N−1 most significant bits of the divisor.

3. The clock divider as recited in claim 1, wherein the trigger value corresponding to an even divisor is a counter value of all logic 0's, and wherein the trigger value corresponding to an odd divisor is a counter value wherein all but the least significant bit of the counter value are logic 0's.

4. The clock divider as recited in claim 1, wherein the detection unit is configured, responsive to an even divisor, to assert the toggle signal to synchronize both rising and falling edges of the output clock signal to rising edges of the input clock signal, and wherein the detection unit is further configured to, responsive to an odd divisor, to assert the toggle signal to synchronize rising and falling edges of the output clock signal to rising and falling edges, respectively, of the input clock signal.

5. The clock divider as recited in claim 2, wherein the clock divider further includes a bypass circuit, wherein the bypass circuit is configured to propagate the input clock signal as the output clock signal when each of the N bits of the divisor is a logic 0.

6. A method comprising:
   a register receiving and storing a divisor by which an input clock signal is to be divided to produce an output clock signal, wherein a least significant bit (LSB) of the divisor indicates whether the divisor is even or odd;

a counter decrementing a counter value from an initial value derived from the divisor, wherein the decrementing is responsive to a first edge of the input clock signal;

a detector detecting that the counter value is equivalent to one of a first trigger or a second trigger value depending on whether the divisor is even or odd, respectively;

asserting one of a first trigger signal or a second trigger signal responsive to detecting the counter value is equivalent to one of the first or second trigger values, respectively; and toggling an output clock signal responsive to the asserting.

7. The method as recited in claim 6, further comprising:

reloading the counter with the initial value responsive to the asserting; and repeating said decrementing, said detecting, said asserting one of the first or second trigger signals, and said toggling.

8. The method as recited in claim 6, wherein the divisor is N bits, wherein the counter value includes N−1 bits, and wherein the initial value comprises the N−1 most significant bits of the divisor, wherein the method further comprises:

detecting the first trigger value when each of the N−1 bits of the counter value are all logic 0's; and detecting the second trigger value when all but the least significant one of the N−1 bits of the counter value are logic 0's.

9. The method as recited in 8, further comprising a bypass circuit causing the input clock signal to be conveyed as the output clock signal responsive to detecting that each of the N bits of the divisor is a logic 0.

10. The method as recited in claim 6, further comprising:

when the divisor is even, toggling the output clock to synchronize rising and falling edges of the output clock signal to rising edges of the input clock signal; and when the divisor is odd, toggling the output clock to synchronize rising and falling edges of the output clock signal to rising and falling edges of the input clock signal, respectively.

11. An integrated circuit comprising:

a clock generation unit configured to generate a first clock signal responsive to a reference clock signal; and a clock divider coupled to receive the first clock signal and further configured to produce an output clock signal by dividing the input clock signal, wherein the clock divider is coupled to receive an N-bit divisor representing an integer value by which a frequency of the first clock signal is to be divided, wherein the clock divider comprises:

a counter coupled to receive a counter value derived from the divisor, wherein the counter is configured to decrement the counter value responsive to a first edge of the first clock signal;

a detector configured to detect when the counter value is equal to a trigger value, wherein the trigger value is dependent on a least significant one of the N bits of the divisor and, responsive to detecting that the counter value is equal to the trigger value, assert a first or second trigger signal depending on the least significant one of the N bits, and further configured to reload the counter with the counter value responsive to detecting the trigger value, and further configured to assert a toggle signal responsive to detecting the trigger value; and an output unit configured to toggle an output clock signal responsive to receiving the toggle signal.

12. The integrated circuit as recited in claim 11, wherein the clock divider includes a bypass unit configured to cause the clock divider to provide the reference clock signal as the output clock signal responsive to detecting that each bit of the N-bit divisor is a logic 0.

13. The integrated circuit as recited in claim 11, wherein the detector is configured to, assert the toggle signal on rising edges of the first clock signal responsive to an even integer value, and further configured to, assert the toggle signal on rising edges and falling edges of the first clock signal to cause rising edges and falling edges of the output clock signal, respectively, responsive to an odd integer value.

14. The integrated circuit as recited in claim 11, wherein the counter value includes N−1 bits, and wherein an initial counter value includes a most significant N−1 bits of the divisor.

15. The integrated circuit as recited in claim 14, wherein the detector is configured to:

assert the first trigger signal responsive to detecting that each of the N−1 bits of the counter are logic 0's and the integer value is even; and assert the second trigger signal responsive to detecting that all but the least significant of the N−1 bits is a logic 0 and the integer value is odd.

16. A system comprising:

a power supply; and an integrated circuit (IC) coupled to receive power from the power supply, wherein the IC includes a clock divider configured to generate a divided clock signal responsive to an input clock signal, wherein the clock divider is programmable with a divisor having N bits that represent an integer value by which a frequency of the input clock signal is to be divided to produce the divided clock signal, wherein the clock divider comprises:

a counter unit that is initialized to an initial counter value corresponding to the divisor and which is configured to decrement the counter value responsive to the input clock signal; and wherein the clock divider is configured to detect that the counter value is equal to a trigger value that depends on whether the integer value is even or odd, and wherein the clock divider is configured to toggle the divided clock signal responsive to detecting that the counter value is equal to the trigger value.

17. The system as recited in claim 16, wherein the clock divider is configured to reinitialize the counter value responsive to detecting the trigger value.

18. The system as recited in claim 16, wherein the counter value includes N−1 bits, wherein the counter unit is configured to initialize the counter value to the N−1 most significant bits of the divisor.

19. The system as recited in claim 18 further comprising a detection unit, wherein the detection unit is configured to:

toggle the divided clock signal responsive to the integer value being even and the counter value equaling 0;

toggle the divided clock signal responsive to the integer value being odd and the counter value equaling 1.

20. The system as recited in claim 16, further comprising a divider unit, wherein the divider unit is configured to synchronize rising edges of the divided clock signal with rising edges of the input clock signal when the integer value is even, and further configured to synchronize rising edges and falling edges of the divided clock signal with rising and falling edges, respectively, of the input clock signal when the integer value is odd.

21. The system as recited in claim 16, wherein the clock divider includes a bypass circuit configured to detect when each of the N bits of the divisor is a logic 0, and further configured to, responsive to detecting that each of the N bits is a logic 0, to provide an operating clock signal at a frequency that is the same as the input clock signal.

* * * * *